United States Patent
Tewalt

(10) Patent No.: US 9,153,311 B1
(45) Date of Patent: Oct. 6, 2015

(54) SYSTEM AND METHOD FOR RETAINING DRAM DATA WHEN REPROGRAMMING RECONFIGURABLE DEVICES WITH DRAM MEMORY CONTROLLERS

(71) Applicant: SRC Computers, LLC., Colorado Springs, CO (US)

(72) Inventor: Timothy J. Tewalt, Larkspur, CO (US)

(73) Assignee: SRC Computers, LLC, Colorado Springs, CO (US)

( * ) Notice: Subject to any disclaimer, the term of this patent is extended or adjusted under 35 U.S.C. 154(b) by 0 days.

(21) Appl. No.: 14/288,094

(22) Filed: May 27, 2014

(51) Int. Cl.
*G11C 7/00* (2006.01)
*G11C 11/406* (2006.01)

(52) U.S. Cl.
CPC ................ *G11C 11/40615* (2013.01)

(58) Field of Classification Search
USPC ......................................................... 365/222
See application file for complete search history.

(56) References Cited

U.S. PATENT DOCUMENTS

| | | | |
|---|---|---|---|
| 6,026,459 A | 2/2000 | Huppenthal |
| 6,076,152 A | 6/2000 | Huppenthal et al. |
| 6,247,110 B1 | 6/2001 | Huppenthal et al. |
| 6,295,598 B1 | 9/2001 | Bertoni et al. |
| 6,339,819 B1 | 1/2002 | Huppenthal et al. |
| 6,356,983 B1 | 3/2002 | Parks |
| 6,434,687 B1 | 8/2002 | Huppenthal |
| 6,594,736 B1 | 7/2003 | Parks |
| 6,836,823 B2 | 12/2004 | Burton |
| 6,941,539 B2 | 9/2005 | Hammes |
| 6,961,841 B2 | 11/2005 | Huppenthal et al. |
| 6,964,029 B2 | 11/2005 | Poznanovic et al. |
| 6,983,456 B2 | 1/2006 | Poznanovic et al. |
| 6,996,656 B2 | 2/2006 | Burton |
| 7,003,593 B2 | 2/2006 | Huppenthal et al. |
| 7,124,211 B2 | 10/2006 | Dickson et al. |
| 7,134,120 B2 | 11/2006 | Hammes |
| 7,149,867 B2 | 12/2006 | Poznanovic et al. |
| 7,155,602 B2 | 12/2006 | Poznanovic |
| 7,155,708 B2 | 12/2006 | Hammes et al. |
| 7,167,976 B2 | 1/2007 | Poznanovic |
| 7,197,575 B2 | 3/2007 | Huppenthal et al. |
| 7,225,324 B2 | 5/2007 | Huppenthal et al. |
| 7,237,091 B2 | 6/2007 | Huppenthal et al. |
| 7,299,458 B2 | 11/2007 | Hammes |

(Continued)

OTHER PUBLICATIONS

Allan, Graham, "DDR IP Integration: How to Avoid Landmines in this Quickly Changing Landscape", Chip Design, Jun./Jul. 2007, pp. 20-22.

(Continued)

*Primary Examiner* — Hoai V Ho
(74) *Attorney, Agent, or Firm* — Peter J. Meza; William J. Kubida; Hogan Lovells US LLP

(57) ABSTRACT

A system and method for retaining dynamic random access memory (DRAM) data when reprogramming reconfigurable devices with DRAM memory controllers such as field programmable gate arrays (FPGAs). The DRAM memory controller is utilized in concert with an internally or externally located data maintenance block wherein the FPGA drives the majority of the DRAM input/output (I/O) and the data maintenance block drives the self-refresh command inputs. Even though the FPGA reconfigures and the majority of the DRAM inputs are tri-stated, the data maintenance block provides stable input levels on the self-refresh command inputs.

19 Claims, 2 Drawing Sheets

(56) References Cited

U.S. PATENT DOCUMENTS

| | | |
|---|---|---|
| 7,373,440 B2 | 5/2008 | Huppenthal et al. |
| 7,406,573 B2 | 7/2008 | Huppenthal et al. |
| 7,421,524 B2 | 9/2008 | Huppenthal et al. |
| 7,424,552 B2 | 9/2008 | Burton |
| 7,565,461 B2 | 7/2009 | Huppenthal et al. |
| 7,620,800 B2 | 11/2009 | Huppenthal et al. |
| 7,680,968 B2 | 3/2010 | Burton |
| 7,703,085 B2 | 4/2010 | Poznanovic et al. |
| 7,890,686 B2 | 2/2011 | Conner |
| 8,589,666 B2 | 11/2013 | Hammes |
| 8,713,518 B2 | 4/2014 | Pointer et al. |
| 2012/0117318 A1 | 5/2012 | Burton et al. |
| 2013/0157639 A1 | 6/2013 | Huppenthal et al. |
| 2014/0211579 A1* | 7/2014 | Lovelace .................. 365/200 |

OTHER PUBLICATIONS

Wilson, Ron, "DRAM Controllers for System Designers", Altera Corporation Articles, 2012, 8 pages.

* cited by examiner

SYSTEM AND METHOD FOR RETAINING DRAM DATA WHEN REPROGRAMMING RECONFIGURABLE DEVICES WITH DRAM MEMORY CONTROLLERS

BACKGROUND OF THE INVENTION

The present invention relates, in general, to the field of reconfigurable computing systems. More particularly, the present invention relates to a system and method for retaining dynamic random access memory (DRAM) data when reprogramming reconfigurable devices with DRAM memory controllers.

The majority of today's programmable logic designs include a DRAM based memory solution at the heart of their memory subsystem. Today's DRAM devices are significantly faster than previous generation's, albeit at the cost of requiring increasingly complex and resource intensive memory controllers. One example is in double data rate 3 and 4 (DDR3 and DDR4) controllers which require read and write calibration logic. This added logic was not necessary when using previous versions of DRAM (e.g. DDR and DDR2. As a result, companies are forced to absorb substantial design costs and increased project completion times when designing proprietary DRAM controllers utilizing modern DRAM technology.

In order to mitigate design engineering costs and verification time, it is very common for field programmable gate array (FPGA) designers to implement vendor provided memory controller intellectual property (IP) when including DRAM based memory solutions in their designs. See, for example, Allan, Graham; "DDR IP Integration: How to Avoid Landmines in this Quickly Changing Landscape"; Chip Design, June/July 2007; pp 20-22 and Wilson, Ron; "DRAM Controllers for System Designers"; Altera Corporation Articles, 2012.

FPGA designers tend to choose device manufacturer IP designs because they are proven, tested and have the incredible benefit of significantly reduced design costs and project completion times. Many times there is the added benefit of exploiting specialized circuitry within the programmable device to increase controller performance, which is not always readily apparent when designing a controller from scratch.

The downside to using factory supplied IP memory controllers is that there is little flexibility when trying to modify operating characteristics. A significant problem arises in reconfigurable computing when the FPGA is reprogrammed during a live application and the memory controller tri-states all inputs and outputs (I/O) between the FPGA device and the DRAM. The result is corrupted data in the memory subsystem. Therefore, dynamically reconfigurable processors are excluded as viable computing options, especially in regard to database applications or context switch processing. The reason for this is that the time it takes to copy the entire contents of DRAM data and preserve it in another part of the system, reconfigure the processor, then finally retrieve the data and restore it in DRAM is just too excessive.

SUMMARY OF THE INVENTION

Disclosed herein is a system and method for preserving DRAM memory contents when a reconfigurable device, for example an FPGA having a DRAM memory controller, is reconfigured, reprogrammed or otherwise powered down. When an FPGA is reprogrammed, the DRAM inputs are tri-stated including self-refresh command signals. Indeterminate states on the reset or clock enable inputs results in DRAM data corruption.

In accordance with the system and method of the present invention, an FPGA based DRAM controller is utilized in concert with an internally or externally located data maintenance block. In operation, the FPGA drives the majority of the DRAM input/output (I/O) and the data maintenance block drives the self-refresh command inputs. Even though the FPGA reconfigures and the majority of the DRAM inputs are tri-stated, the data maintenance block provides stable input levels on the self-refresh command inputs.

Functionally, the data maintenance block does not contain the memory controller and therefore has no point of reference for when and how to initiate the self-refresh commands, particularly the DRAM self-refresh mode. As also disclosed herein, a communication port is implemented between the FPGA and the data maintenance block that allows the memory controller in the FPGA to direct the self-refresh commands to the DRAM via the data maintenance block. Specifically, this entails when to put the DRAM into self-refresh mode and preserve the data in memory.

At this point, the DRAM data has been preserved throughout the FPGA reconfiguration via the self-refresh mode initiated by the data maintenance block, but the DRAM controller must now re-establish write/read timing windows and will corrupt specific address contents with guaranteed write and read data required during the calibration/leveling process. Consequently, using the self-refresh capability of DRAM alone is not adequate for maintaining data integrity during reconfiguration. (It should be noted that the memory addresses used during calibration/leveling are known and typically detailed in the controller IP specification).

In order to effectuate this, the system transmits a "reconfiguration request" to the DRAM controller. Once received, glue logic surrounding the FPGA vendor provided memory controller IP issues read requests to the controller specifying address locations used during the calibration/leveling process. As data is retrieved from the DRAM, it is transmitted via the communication port from the FPGA device to a block of storage space residing within the data maintenance block itself or another location in the system.

Once the process is complete, the data maintenance block sends a self-refresh command to the DRAM and transmits an acknowledge signal back to the FPGA. The data maintenance block recognizes this as an FPGA reconfiguration condition versus an FPGA initial power up condition and retains this state for later use.

Once the FPGA has been reprogrammed, the DRAM controller has re-established calibration settings and several specific addresses in the DRAM have been corrupted with guaranteed write/read data patterns. At this point, glue logic surrounding the vendor memory controller IP is advised by the data maintenance block (through the communication port) that it has awakened from either an initial power up condition or a reconfiguration condition. If a reconfiguration condition is detected, and before processing incoming DMA requests, the controller retrieves stored DRAM data from the data maintenance block (again through the communication port) and writes it back to the specific address locations corrupted during the calibration/leveling process. Once complete, the DRAM controller in the FPGA is free to begin servicing system memory requests in the traditional fashion.

Among the benefits provided in conjunction with the system and method of the present invention is that since the data maintenance block functions to hold the DRAM in self-refresh mode, the FPGA is free to be reprogrammed to perform a very application-specific computing job that may not require DRAM. This means all the device resources previously reserved for creating a DRAM controller are now free to be used for different functions.

Further, the overall computer system benefits from the present invention because data previously stored in DRAM has now been preserved and is available for use by the next application that needs it. This leads to the fact that computing solutions requiring a series of specific data manipulation tasks now have the ability to be implemented in a small reconfigurable processor. Each application performs its intended function and data is passed from application to application between reconfiguration periods via the DRAM.

Importantly, it should also be noted that the DRAM data contents are retained even if the reconfigurable device is powered down. This is especially critical, for example, when the system and method of the present invention is implemented in mobile devices.

Particularly disclosed herein is a system and method for preserving DRAM data contents when reconfiguring a device containing one or more DRAM controllers. Also particularly disclosed herein is a system and method for preserving DRAM data contents in a reconfigurable computing environment when the programmable device is reconfigured with a new design that does not include a DRAM controller. Further disclosed herein is a system and method for passing DRAM data between sequential computing tasks in a reconfigurable computing environment as well as system and method for preserving DRAM contents when the reconfigurable device is powered down.

Also particularly disclosed herein is a computer system which comprises a DRAM memory, a reconfigurable logic device having a memory controller coupled to selected inputs and outputs of the DRAM memory and a data maintenance block coupled to the reconfigurable logic device and self-refresh command inputs of the DRAM memory. The data maintenance block is operative to provide stable input levels on the self-refresh command inputs while the reconfigurable logic device is reconfigured.

Still further particularly disclosed herein is a method for preserving the contents of a DRAM memory associated with a reconfigurable device having a memory controller. The method comprises providing a data maintenance block coupled to the reconfigurable device, coupling the data maintenance block to self-refresh command inputs of the DRAM memory, storing data received from the reconfigurable device at the data maintenance block and maintaining stable input levels on the self-refresh command inputs while the reconfigurable logic device is reconfigured.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
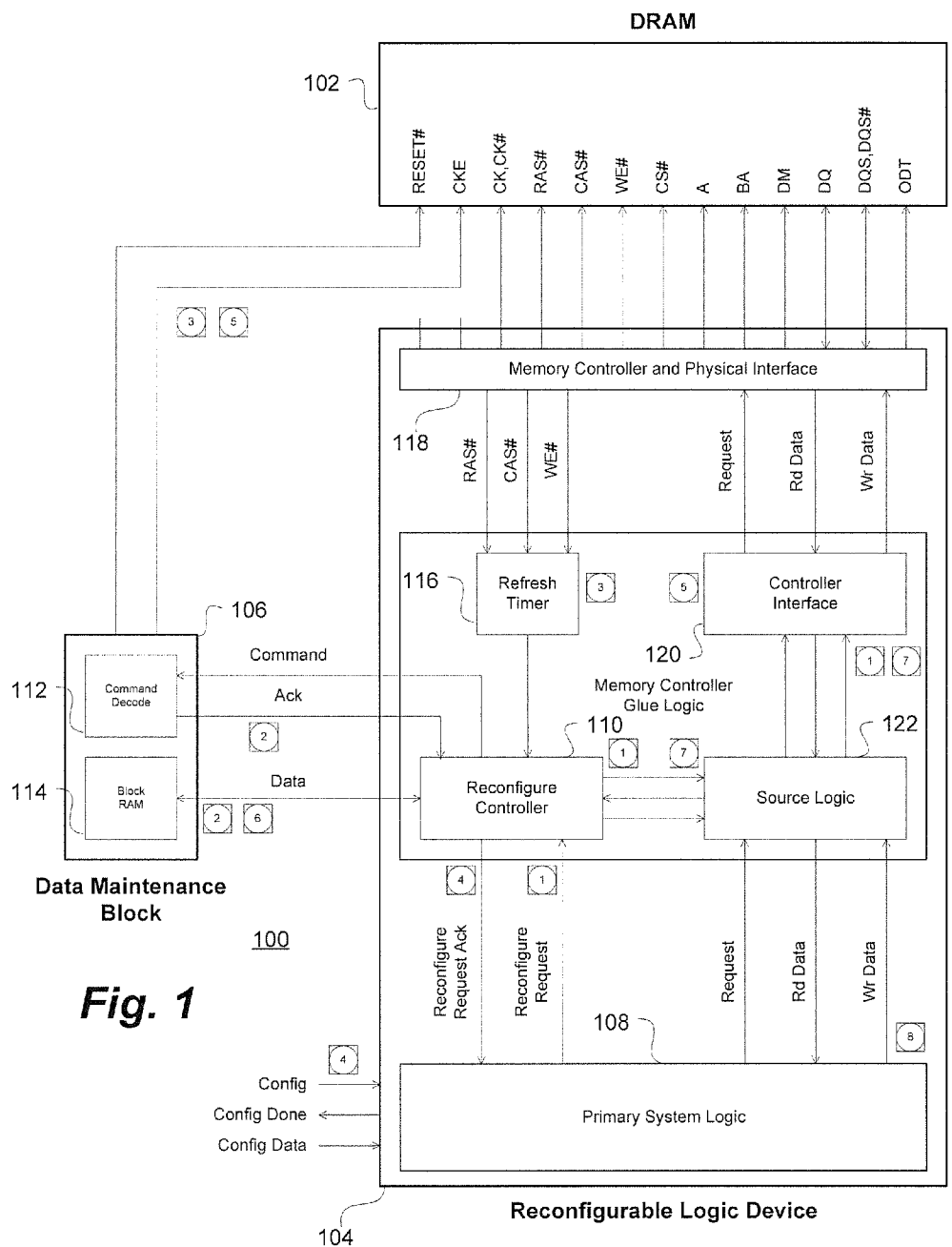
FIG. 1 is a functional block diagram of a computer subsystem comprising a reconfigurable logic device having a reconfigurable DRAM controller with associated DRAM memory and illustrating the data maintenance block of the present invention for retaining DRAM data when the logic device is reconfigured.

With reference now to FIG. 1, a functional block diagram of a computer subsystem 100 comprising a DRAM memory 102 and reconfigurable logic device 104 is shown. In a representative embodiment of the present invention, the reconfigurable logic device 104 may comprise a field programmable gate array (FPGA). However, it should be noted that the reconfigurable logic device 104 may comprise any and all forms of reconfigurable logic devices including hybrid devices, such as a reconfigurable logic device with partial reconfiguration capabilities or an application specific integrated circuit (ASIC) device with reprogrammable regions contained within the chip.

Also illustrated is a data maintenance block 106 in accordance with the present invention for retaining DRAM memory 102 data when the logic device 104 is reconfigured during operation of the computer subsystem 100. In a representative embodiment of the present invention, the data maintenance block 106 may be conveniently provided as a complex programmable logic device (CPLD) or other separate integrated circuit device or, in alternative embodiments, may be provided as a portion of an FPGA comprising the reconfigurable logic device 104.

As illustrated, the reconfigurable logic device 104 comprises a primary system logic block 108 which issues a reconfigure request command to a reconfigure controller 110 and receives a reconfigure request acknowledgement (Ack) signal in return. The reconfigure controller 110, in turn, issues a command to the command decode block 112 of the data maintenance block 106 and receives an acknowledgement (Ack) signal in return. A block RAM portion 114 of the data maintenance block 106 exchanges data with the reconfigure controller 110.

The reconfigure controller 110 receives an input from a refresh timer 116 which is coupled to receive row address select (RAS#), column address select (CAS#) and write enable (WE#) signals from a memory controller and physical interface block 118. The memory controller and physical interface block 118 also provides the RAS#, CAS# and WE# signals to the DRAM memory 102 as well as clock (CR, CK#), chip select (CS#), address (A), bank address (BA), data mask (DM) and on-die termination (ODT) input signals. Bidirectional data (DQ) input/output (I/O) and differential data strobe signals (DQS/DQS#) are exchanged between the DRAM memory 102 and the memory controller and physical interface block 118 as shown. The data maintenance block 106 is coupled to the DRAM memory 102 to supply reset (RESET#) and clock enable (CKE#) signals thereto.

The memory controller and physical interface block 118 responds to a request from the controller interface 120 to provide data read from the DRAM memory 102 (Rd Data) and to receive data to be written to the DRAM memory 102 (Wr Data) as shown. A source logic block 122 is coupled to the controller interface 120 as well as the reconfigure controller 110 as also illustrated. The source logic block 122 receives a data request from the primary system logic block 108 and supplies data read from the DRAM memory 102 while receiving data to be written thereto.

As indicated by the operation at numeral 1, a reconfiguration request is received at the reconfigure controller 110 from the primary system logic block 108 of the reconfigurable logic device 104. The reconfigure controller 110 initiates direct memory access (DMA) read requests to memory addresses used in a calibration/leveling sequence after the reconfigurable logic device 104 is reconfigured. Returned data is stored in a small section of block RAM (not shown) in the reconfigure controller 110.

As indicated by the operation at numeral 2, the reconfigure Controller 110 stores its block RAM contents in another small section of block RAM 114 located in the data maintenance block 106. When complete, the data maintenance block 106 asserts an acknowledge signal from its command decode block 112. At the operation indicated by numeral 3, the reconfigure controller 110 detects a refresh command from the refresh timer 116, waits a refresh cycle time ($t_{RFC}$) and instructs the data maintenance block 106 to de-assert CKE to the DRAM memory 102.

The reconfigure controller 110 asserts the Reconfigure Request Ack signal at the operation indicated by numeral 4 and the reconfigurable logic device 104 is reconfigured. As indicated by the operation at numeral 5, the reconfigure controller 110 recognizes a post-reconfigure condition (Ack=High), holds the memory controller and physical interface 118 in reset and instructs the data maintenance block 106 to assert CKE to the DRAM memory 102. The memory controller and physical interface 118 is then released from reset and initializes the DRAM memory 102.

At the operation indicated by numeral 6, the reconfigure controller 110 retrieves the data maintenance block 106 block RAM 114 contents and stores it in a small section of block RAM (not shown) in the reconfigure controller 110. The reconfigure controller 110 detects that the memory controller and physical interface 118 and DRAM memory 102 initialization is complete at the operation indicated by numeral 7 and initiates DMA write requests to restore the memory contents corrupted during the calibration/leveling sequence with the data values read prior to reconfiguration. At the operation indicated by numeral 8, the memory controller and physical interface 118 glue logic (comprising reconfigure controller 110, refresh timer 116, controller interface 120 and source logic block 122) resumes DMA activity with the primary system logic 108 in a conventional fashion.

It should be noted certain of the aforementioned operational steps may, in fact, operate substantially concurrently. Further, while functionally accurate, some of the operational steps enumerated have been listed out of order to provide logical continuity to the overall operation and to facilitate comprehensibility of the process. In a particular implementation of the system and method of the present invention, one or more of the operational steps disclosed may be conveniently re-ordered to increase overall hardware efficiency. Moreover, steps which can serve to facilitate relatively seamless integration in an active application can be provided in addition to those described as may be desired.

Figure 2:
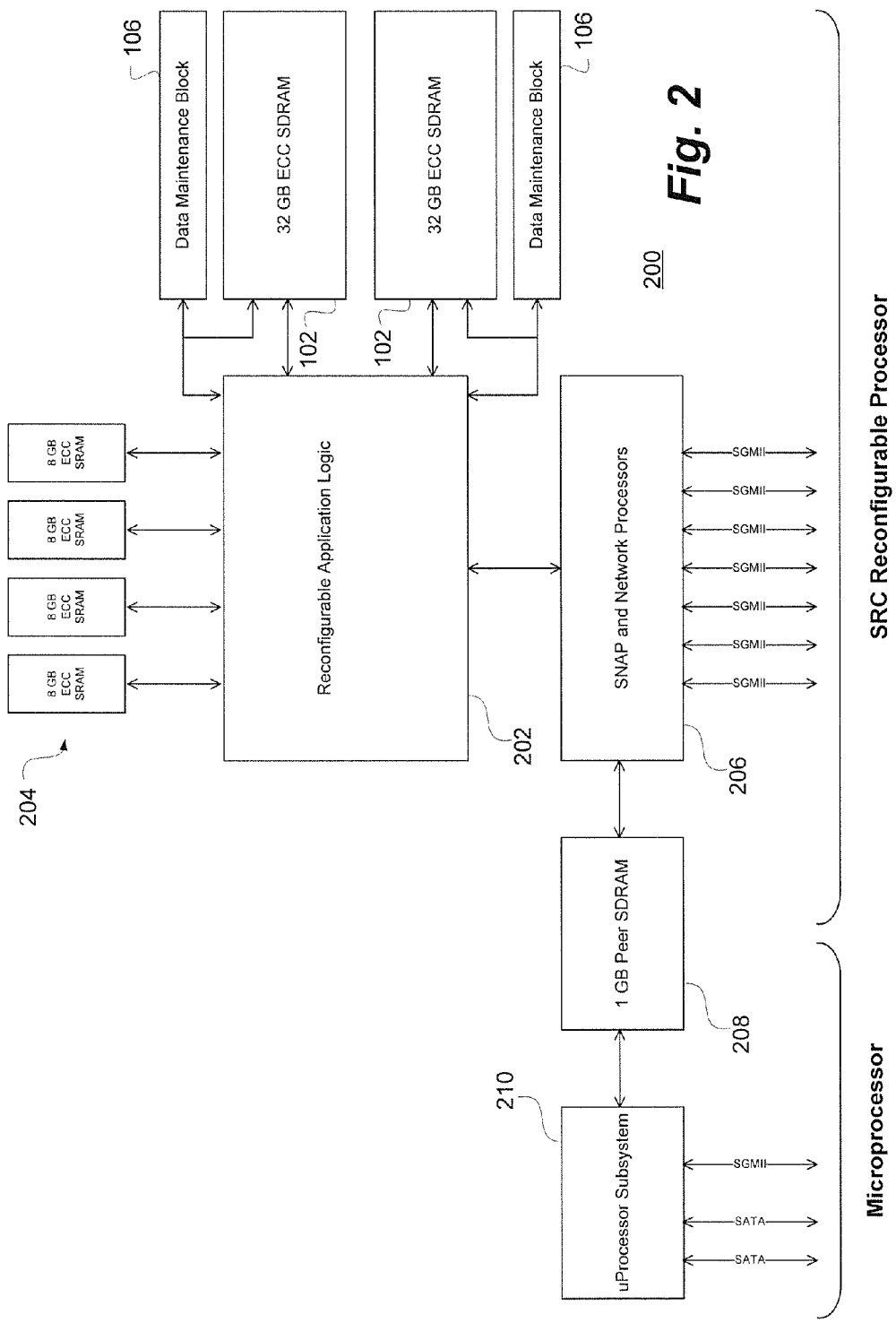
FIG. 2 is a block diagram of a reconfigurable computer system, such as that available from SRC Computers, LLC, assignee of the present invention, incorporating a pair of data maintenance blocks and DRAM memory in accordance with the system and method of the present invention in association with reconfigurable application logic.

With reference additionally now to FIG. 2, a block diagram of a reconfigurable computer system 200 is illustrated incorporating a pair of data maintenance blocks 106 and DRAM memory 102 in accordance with the system and method of the present invention in association with reconfigurable application logic 202. In this representative embodiment of a reconfigurable computer system 200, the DRAM memory 102 is illustrated in the form of 32 GB error correction code (ECC) synchronous dynamic random access memory (SDRAM).

The reconfigurable application logic 202 is coupled to the data maintenance blocks 106 and DRAM memory 102 as depicted and described previously with respect to the preceding figure and is also illustrated as being coupled to a number of 8 GB ECC static random access memory (SRAM) memory modules 204. The reconfigurable application logic 202 is also coupled to an SRC Computers, LLC SNAP™ and network processors block 206 having a number of serial gigabit media independent interface (SGMII) links as shown. It should be noted that the DRAM memory 102 controller in the reconfigurable application block 202 may be omitted upon subsequent reconfigurations as the DRAM memory 102 data contents will be maintained in the data maintenance blocks 106.

The SNAP and network processors block 206 shares equal read/write access to a 1 GB peer SDRAM system memory 208 along with a microprocessor subsystem 210. The microprocessor subsystem 210, as illustrated, also comprises an SGMII link as well as a pair of serial advanced technology attachment (SATA) interfaces.

For continuity and clarity of the description herein, the term "FPGA" has been used in conjunction with the representative embodiment of the system and method of the present invention and refers to just one type of reconfigurable logic device. However, it should be noted that the concept disclosed herein is applicable to any and all forms of reconfigurable logic devices including hybrid devices, inclusive of reconfigurable logic devices with partial reconfiguration capabilities or an ASIC device with reprogrammable regions contained within the chip.

Representative embodiments of dynamically reconfigurable computing systems incorporating the DRAM memory 102, reconfigurable logic device 104, associated microprocessors and programming techniques are disclosed in one or more of the following United States Patents and United States Patent Publications to SRC Computers LLC, assignee of the present invention, the disclosures of which are herein specifically incorporated by this reference in their entirety: U.S. Pat. No. 6,026,459; U.S. Pat. No. 6,076,152; U.S. Pat. No. 6,247,110; U.S. Pat. No. 6,295,598; U.S. Pat. No. 6,339,819; U.S. Pat. No. 6,356,983; U.S. Pat. No. 6,434,687; U.S. Pat. No. 6,594,736; U.S. Pat. No. 6,836,823; U.S. Pat. No. 6,941,539; U.S. Pat. No. 6,961,841; U.S. Pat. No. 6,964,029; U.S. Pat. No. 6,983,456; U.S. Pat. No. 6,996,656; U.S. Pat. No. 7,003,593; U.S. Pat. No. 7,124,211; U.S. Pat. No. 7,134,120; U.S. Pat. No. 7,149,867; U.S. Pat. No. 7,155,602; U.S. Pat. No. 7,155,708; U.S. Pat. No. 7,167,976; U.S. Pat. No. 7,197,575; U.S. Pat. No. 7,225,324; U.S. Pat. No. 7,237,091; U.S. Pat. No. 7,299,458; U.S. Pat. No. 7,373,440; U.S. Pat. No. 7,406,573; U.S. Pat. No. 7,421,524; U.S. Pat. No. 7,424,552; U.S. Pat. No. 7,565,461; U.S. Pat. No. 7,620,800; U.S. Pat. No. 7,680,968; U.S. Pat. No. 7,703,085; U.S. Pat. No. 7,890,686; U.S. Pat. No. 8,589,666; U.S. Pat. Pub. No. 2012/0117318; U.S. Pat. Pub. No. 2012/0117535; and U.S. Pat. Pub. No. 2013/0157639.

While there have been described above the principles of the present invention in conjunction with specific apparatus and methods, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A computer system comprising:
    a DRAM memory;
    a reconfigurable logic device having a memory controller coupled to selected inputs and outputs of said DRAM memory; and
    a data maintenance block coupled to said reconfigurable logic device and self-refresh command inputs of said DRAM memory, said data maintenance block operative to provide stable input levels on said self-refresh command inputs while said reconfigurable logic device is reconfigured.

2. The computer system of claim 1 wherein said DRAM memory comprises DDR3 compliant memory devices.

3. The computer system of claim 1 wherein said reconfigurable logic device comprises an FPGA.

4. The computer system of claim 1 wherein said data maintenance block comprises a command decode portion coupled to a reconfigure controller of said reconfigurable logic device.

5. The computer system of claim 4 wherein said command decode portion of said data maintenance block is operative in response to a command from said reconfigure controller and provides an acknowledgement signal in response.

6. The computer system of claim 1 wherein said data maintenance block comprises a memory block coupled to a reconfigure controller of said reconfigurable logic device.

7. The computer system of claim 6 wherein said memory block is operative to retain data received from said reconfigure controller of said reconfigurable logic device.

8. The computer system of claim 1 wherein said data maintenance block comprises a CPLD.

9. The computer system of claim 1 wherein said reconfigurable logic device comprises said data maintenance block.

10. The computer system of claim 1 wherein said data maintenance block is operable to hold said DRAM memory in self-refresh mode while said reconfigurable logic device is reconfigured.

11. A method for preserving contents of a DRAM memory associated with a reconfigurable device having a memory controller comprising:
    providing a data maintenance block coupled to said reconfigurable device;
    coupling said data maintenance block to self-refresh command inputs of said DRAM memory;
    storing data received from said reconfigurable device at said data maintenance block; and
    maintaining stable input levels on said self-refresh command inputs while said reconfigurable logic device is reconfigured.

12. The method of claim 11 wherein said step of providing comprises:
    providing a command decode portion of said data maintenance block coupled to receive commands from said reconfigurable device and return acknowledgment signals in response thereto.

13. The method of claim 11 wherein said step of storing comprises:
    providing a memory block in said data maintenance block for storing said data received from said reconfigurable device and returning said data to said reconfigurable device upon completion of a reconfiguration function.

14. The method of claim 11 wherein said step of storing comprises:
    providing a memory block in said data maintenance block for storing said data received directly from said DRAM memory and returning said data directly to said DRAM memory upon completion of a reconfiguration function.

15. The method of claim 11 wherein said step of providing said data maintenance block comprises:
    providing a portion of said reconfigurable device as said data maintenance block.

16. The method of claim 11 wherein said step of providing said data maintenance block comprises:
    providing a CPLD as said data maintenance block.

17. The method of claim 11 wherein said step of providing said data maintenance block comprises:
    providing a block RAM for storing said data received from said reconfigurable device; and
    providing a command decode portion responsive to said reconfigurable device and coupled to said reset and lock enable inputs of said DRAM memory.

18. The method of claim 11 further comprising:
    passing said data between sequential computing tasks in a reconfigurable computing environment.

19. The method of claim 11 further comprising:
    preserving said data at said data maintenance block while said reconfigurable logic device is powered down.

* * * * *